(12) United States Patent
Edwards

(10) Patent No.: US 10,852,788 B2
(45) Date of Patent: Dec. 1, 2020

(54) COMPUTER COMPONENT COOLING DEVICE AND METHOD

(71) Applicant: George Anthony Edwards, San Marcos, CA (US)

(72) Inventor: George Anthony Edwards, San Marcos, CA (US)

( * ) Notice: Subject to any disclaimer, the term of this patent is extended or adjusted under 35 U.S.C. 154(b) by 0 days.

(21) Appl. No.: 16/709,116

(22) Filed: Dec. 10, 2019

(65) Prior Publication Data

US 2020/0192440 A1 Jun. 18, 2020

Related U.S. Application Data

(60) Provisional application No. 62/917,500, filed on Dec. 12, 2018.

(51) Int. Cl.
| | | |
|---|---|---|
| *H05K 7/20* | (2006.01) | |
| *G06F 1/20* | (2006.01) | |
| *H01L 23/28* | (2006.01) | |
| *F25B 21/02* | (2006.01) | |
| *H01L 23/473* | (2006.01) | |
| *H01L 23/38* | (2006.01) | |

(52) U.S. Cl.
CPC ............ *G06F 1/20* (2013.01); *H01L 23/38* (2013.01); *H01L 23/473* (2013.01)

(58) Field of Classification Search
CPC .......... G06F 1/20; H01L 23/38; H01L 23/473
USPC ....................................................... 361/695
See application file for complete search history.

(56) References Cited

U.S. PATENT DOCUMENTS

| | | | |
|---|---|---|---|
| 4,935,864 A | 6/1990 | Schmidt et al. | |
| 5,006,796 A | 4/1991 | Burton et al. | |
| 5,285,347 A * | 2/1994 | Fox ........................ | G06F 1/20 |
| | | | 165/80.3 |
| 5,706,668 A * | 1/1998 | Hilpert .................... | G06F 1/20 |
| | | | 361/690 |
| 5,731,954 A * | 3/1998 | Cheon ..................... | F25B 21/02 |
| | | | 165/104.33 |
| 6,109,039 A | 8/2000 | Hougham et al. | |

(Continued)

FOREIGN PATENT DOCUMENTS

| | | | | |
|---|---|---|---|---|
| CN | 205334348 U | 6/2016 | | |
| WO | WO-2005011349 A2 * | 2/2005 | ........... | H01L 23/473 |

OTHER PUBLICATIONS

International Search Report and Written Opinion for corresponding application PCT/US2019/065546 dated Feb. 12, 2020 (17 pages).

*Primary Examiner* — Anatoly Vortman

(74) *Attorney, Agent, or Firm* — Procopio Cory Hargreaves and Savitch LLP

(57) ABSTRACT

A computer component cooling device to cool one or more heat-emitting components of a computer comprising a fan that draws air there through in a flow path; a heat transfer tank including one or more channels therein to circulate a heat transfer fluid there through; a pump that pumps the heat transfer between the heat transfer tank and one or more component heat exchangers to cool the one or more heat-emitting components of the computer; a heat exchanger including a plurality of heating elements extending therefrom and into the flow path; and one or more Peltier devices including one or more cold sides thermally coupled to the heat transfer tank and one or more hot sides thermally coupled to the heat exchanger.

15 Claims, 6 Drawing Sheets

(56) References Cited

U.S. PATENT DOCUMENTS

| | | | | |
|---|---|---|---|---|
| 6,166,907 A | * | 12/2000 | Chien | F28D 1/0478 165/104.33 |
| 6,196,003 B1 | | 3/2001 | Macias et al. | |
| 6,234,240 B1 | | 5/2001 | Cheon | |
| 6,282,089 B1 | | 8/2001 | Nakanishi et al. | |
| 6,351,382 B1 | | 2/2002 | Nakanishi et al. | |
| 6,415,612 B1 | | 7/2002 | Pokharna et al. | |
| 6,463,743 B1 | | 10/2002 | Lalibert | |
| 6,496,367 B2 | | 12/2002 | Donahoe et al. | |
| 6,646,879 B2 | | 11/2003 | Pautsch | |
| 6,650,536 B2 | | 11/2003 | Lee et al. | |
| 6,705,089 B2 | * | 3/2004 | Chu | F25B 21/02 136/204 |
| 6,725,682 B2 | | 4/2004 | Scott | |
| 6,775,162 B2 | | 8/2004 | Mihai et al. | |
| 7,403,392 B2 | | 7/2008 | Attlesey et al. | |
| 7,609,518 B2 | | 10/2009 | Hopton et al. | |
| 7,688,584 B1 | | 3/2010 | Becklin | |
| 7,712,325 B2 | | 5/2010 | Shapiro | |
| 7,817,423 B2 | | 10/2010 | Morehead | |
| 7,905,106 B2 | | 3/2011 | Attlesey | |
| 7,974,090 B2 | | 7/2011 | Risher-Kelly | |
| 8,166,769 B2 | | 5/2012 | Morand | |
| 8,274,787 B2 | | 9/2012 | Alyaser et al. | |
| 8,522,570 B2 | | 9/2013 | Ouyang et al. | |
| 8,982,560 B2 | | 3/2015 | MacDonald | |
| 9,265,178 B2 | | 2/2016 | Arvelo et al. | |
| 9,301,423 B2 | | 3/2016 | Savelli et al. | |
| 9,343,645 B2 | | 5/2016 | Bartl et al. | |
| 9,345,175 B2 | | 5/2016 | Kubota | |
| 9,423,163 B2 | | 8/2016 | Walls et al. | |
| 9,445,524 B2 | | 9/2016 | Lofy et al. | |
| 9,504,189 B1 | | 11/2016 | Campbell et al. | |
| 9,698,623 B2 | | 7/2017 | Adams et al. | |
| 9,850,817 B2 | | 12/2017 | Pal | |
| 10,349,561 B2 | | 7/2019 | Farshchian et al. | |
| 10,386,897 B2 | | 8/2019 | Rivera, Jr. et al. | |
| 10,609,841 B2 | * | 3/2020 | Xiao | G06F 1/203 |
| 2003/0188538 A1 | * | 10/2003 | Chu | F25B 21/02 62/3.2 |
| 2004/0123977 A1 | | 7/2004 | Pokharna et al. | |
| 2005/0083657 A1 | * | 4/2005 | Hamman | F28D 15/00 361/699 |
| 2005/0231914 A1 | | 10/2005 | Mikubo | |
| 2006/0060333 A1 | * | 3/2006 | Chordia | H01L 23/473 165/104.33 |
| 2006/0090787 A1 | | 5/2006 | Onvural | |
| 2006/0187638 A1 | | 8/2006 | Vinson et al. | |
| 2007/0035928 A1 | * | 2/2007 | Hamman | G06F 1/20 361/701 |
| 2007/0163270 A1 | | 7/2007 | Chien et al. | |
| 2008/0028767 A1 | | 2/2008 | Broderick | |
| 2008/0229759 A1 | | 9/2008 | Ouyang et al. | |
| 2013/0174578 A1 | | 7/2013 | Brija | |
| 2013/0205822 A1 | | 8/2013 | Heiland et al. | |
| 2016/0161998 A1 | | 6/2016 | Kinstle, III | |
| 2017/0098748 A1 | | 4/2017 | Steutermann | |
| 2017/0245357 A1 | * | 8/2017 | Shih | G06F 1/20 |
| 2018/0004259 A1 | * | 1/2018 | Kulkarni | F25B 21/02 |
| 2018/0088637 A1 | | 3/2018 | Lenovo | |

* cited by examiner

COMPUTER COMPONENT COOLING DEVICE AND METHOD

CROSS REFERENCE TO RELATED APPLICATIONS

This application claims priority under 35 U.S.C. 119 to U.S. provisional patent application No. 62/917,500, filed Dec. 12, 2018, which is incorporated by reference herein.

BACKGROUND

Related Field

The subject matter discussed herein relates generally to the field of computer enclosure cooling units.

Related Background

A substantial problem exists in keeping computer enclosures cooled. Typically a computer enclosure houses numerous semiconductor units, certain motorized units, and power supplies, all of which tend to be in varying degrees inefficient and therefore heat producing. Semiconductor units typically have an optimal temperature operating range at or below room temperature (20 degrees Celsius). Most computer enclosures are air cooled with blowers or fans circulating air from the enclosure into the ambient of the room within which the computer enclosure is located.

As the operating speed of the various semiconductor devices within computers increases, the inefficiencies and thus the heat generation of the individual semiconductor devices, and in particular the central processing unit or CPU generates dramatic quantities of heat. The excess heat generated, in turn, degrades the operation of the individual semiconductor device further, where by a degenerative spiral of operating characteristics is encountered limiting the operating speed of the individual semiconductor unit and thus of the computer.

Computer enclosure cooling systems such as fans and blowers are well known in the art, but are proving to be unsuccessful in cooling the various semiconductor devices operating at ever increasing speeds and generating ever increasing heat within computers.

SUMMARY

An aspect of the invention involves a computer component cooling device to cool one or more heat-emitting components of a computer comprising a fan that draws air there through in a flow path; a heat transfer tank including one or more channels therein to circulate a heat transfer fluid there through; a pump that pumps the heat transfer between the heat transfer tank and one or more component heat exchangers to cool the one or more heat-emitting components of the computer; a heat exchanger including a plurality of heating elements extending therefrom and into the flow path; and one or more Peltier devices including one or more cold sides thermally coupled to the heat transfer tank and one or more hot sides thermally coupled to the heat exchanger.

One or more implementations of the aspect of the invention described immediately above includes one or more of the following: the computer component cooling device is a self-contained preassembled computer component cooling device; the one or more heat-emitting components of the computer include one or more semiconductors; the one or more semiconductors include one or more microprocessors; the pump is a combined pump and liquid block; the heat transfer tank is a copper tank; a copper plate cover for the copper tank; a Peltier plate including the one or more Peltier devices; a copper plate between the Peltier plate and the heat exchanger; a steel cover plate over the heat exchanger; in and out tube connections to communicate the heat transfer fluid between the heat transfer tank and the one or more heat-emitting components of the computer; the heat exchanger includes a base that the plurality of heating elements extend from; heat exchanger copper pipes extending from the base in an opposition direction from the plurality of heating elements; the heat exchanger copper pipes include successively surrounded U-shaped heat pipes; and/or a control card including one or more processors to automatically adjust the flow rate of the heat transfer fluid by the pump in a closed end liquid loop, and automatically adjusts voltage to the one or more Peltier devices to control the heating and cooling effect of the one or more Peltier devices, to maintain maximum performance for cooling the one or more heat-emitting components of the computer.

An aspect of the invention involves a method of using the computer component cooling device of the aspect of the invention described immediately comprising providing the computer component cooling device in a back of a computer case; fluidly communicating the heat transfer tank to the one or more component heat exchangers through in and out tubing; electrically communicating the control card to a motherboard of the computer, the control card including one or more processors; with the one or more processors of the control card, automatically adjusting the flow rate of the heat transfer fluid by the pump in a closed end liquid loop, and automatically adjusting voltage to the one or more Peltier devices to control the heating and cooling effect of the one or more Peltier devices, to maintain maximum performance for cooling the one or more heat-emitting components of the computer.

One or more implementations of the aspect of the invention described immediately above includes one or more of the following: the fan and flow path are in the back of the computer case, and the method further comprising causing the fan to cause air to flow over the plurality of heating elements extending from the heat exchanger in the flow path to draw heat from the heat exchanger; the computer component cooling device is a self-contained preassembled computer component cooling device; the one or more heat-emitting components of the computer include one or more semiconductors; the one or more semiconductors include one or more microprocessors; the pump is a combined pump and liquid block; the heat transfer tank is a copper tank; a copper plate cover for the copper tank; a Peltier plate including the one or more Peltier devices; a copper plate between the Peltier plate and the heat exchanger; a steel cover plate over the heat exchanger; in and out tube connections to communicate the heat transfer fluid between the heat transfer tank and the one or more heat-emitting components of the computer; the heat exchanger includes a base that the plurality of heating elements extend from; heat exchanger copper pipes extending from the base in an opposition direction from the plurality of heating elements; the heat exchanger copper pipes include successively surrounded U-shaped heat pipes; and/or a control card including one or more processors to automatically adjust the flow rate of the heat transfer fluid by the pump in a closed end liquid loop, and automatically adjusts voltage to the one or more Peltier devices to control the heating and cooling effect of the one or more Peltier devices, to maintain maximum performance for cooling the one or more heat-emitting components of the computer.

Other features and advantages of the present invention will become more readily apparent to those of ordinary skill in the art after reviewing the following detailed description and accompanying drawings.

DETAILED DESCRIPTION

The subject matter described herein is taught by way of example implementations. Various details have been omitted for the sake of clarity and to avoid obscuring the subject matter. The examples shown below are directed to a self-contained preassembled semiconductor computer cooling system, a self-contained preassembled semiconductor computer cooling system device, and a method of using a self-contained preassembled semiconductor computer cooling system and device. Other features and advantages of the subject matter should be apparent from the following description.

After reading this description it will become apparent to one skilled in the art how to implement the invention in various alternative embodiments and alternative applications. However, all the various embodiments of the present invention will not be described herein. It is understood that the embodiments presented here are presented by way of an example only, and not limitation.

Figure 1:
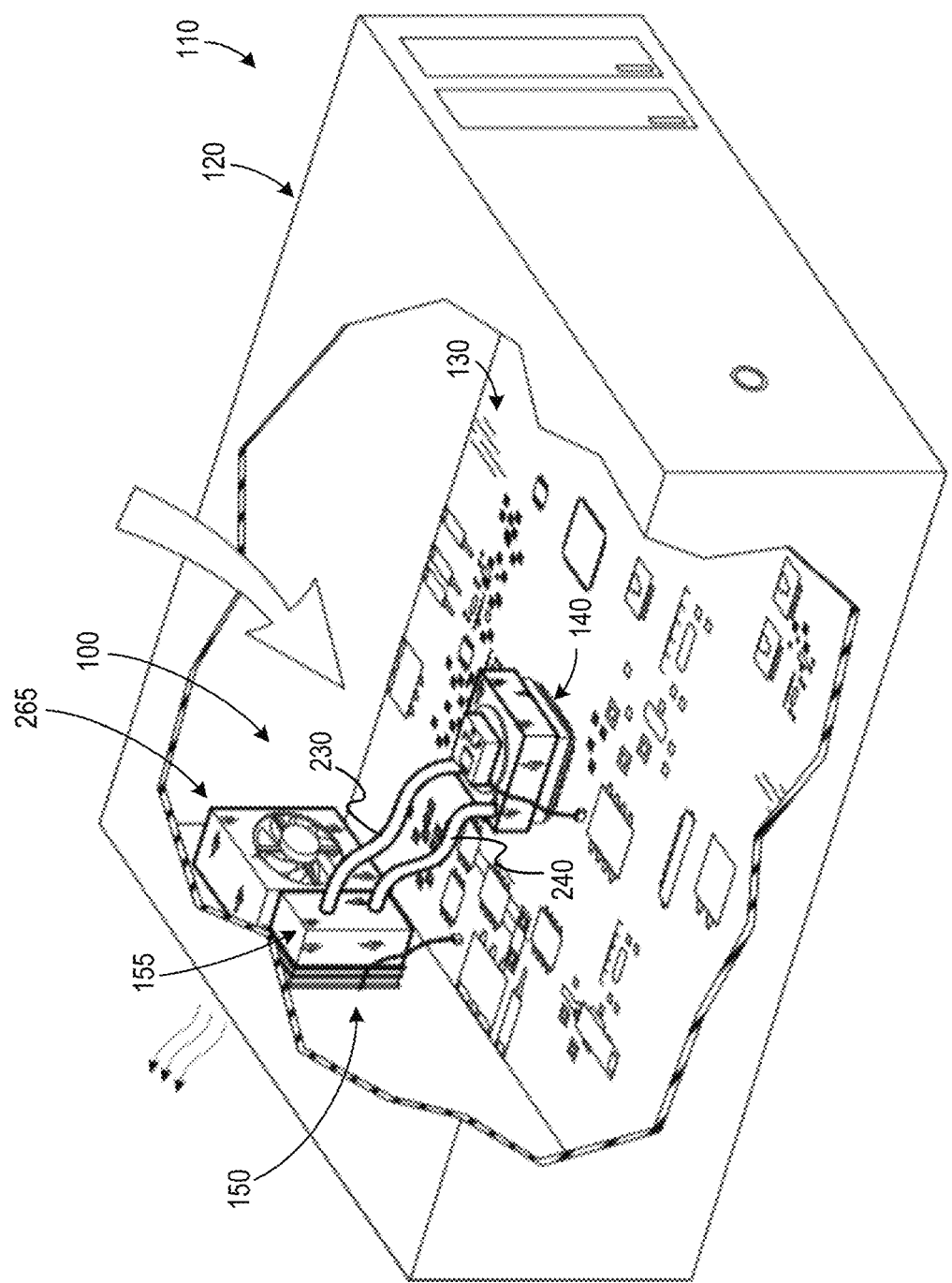
FIG. 1 is a perspective cutaway view of a computer terminal including an embodiment of a self-contained preassembled semiconductor computer cooling system.
Figure 2:
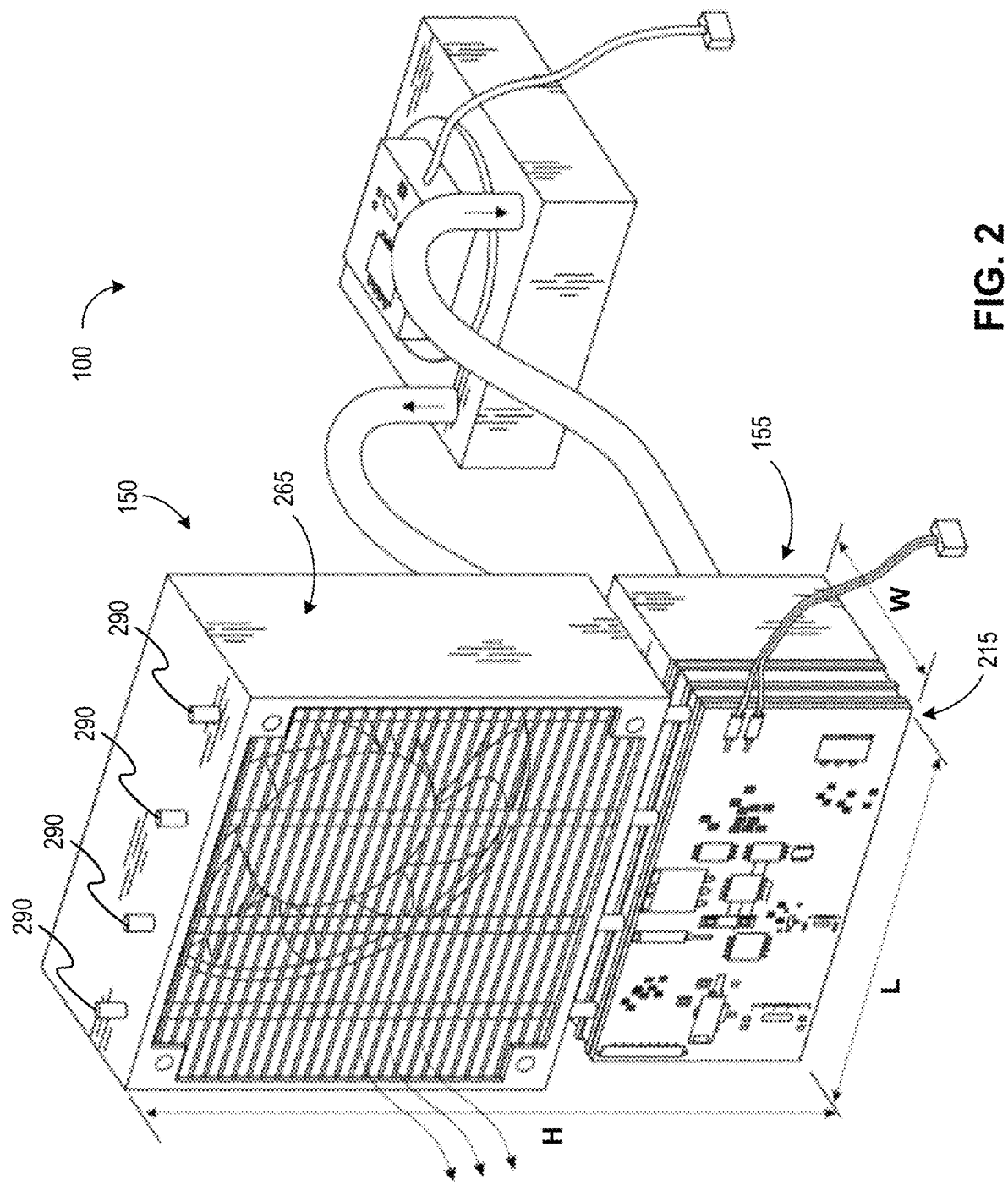
FIG. 2 is a perspective view of the self-contained preassembled semiconductor computer cooling system of FIG. 1.
Figure 3:
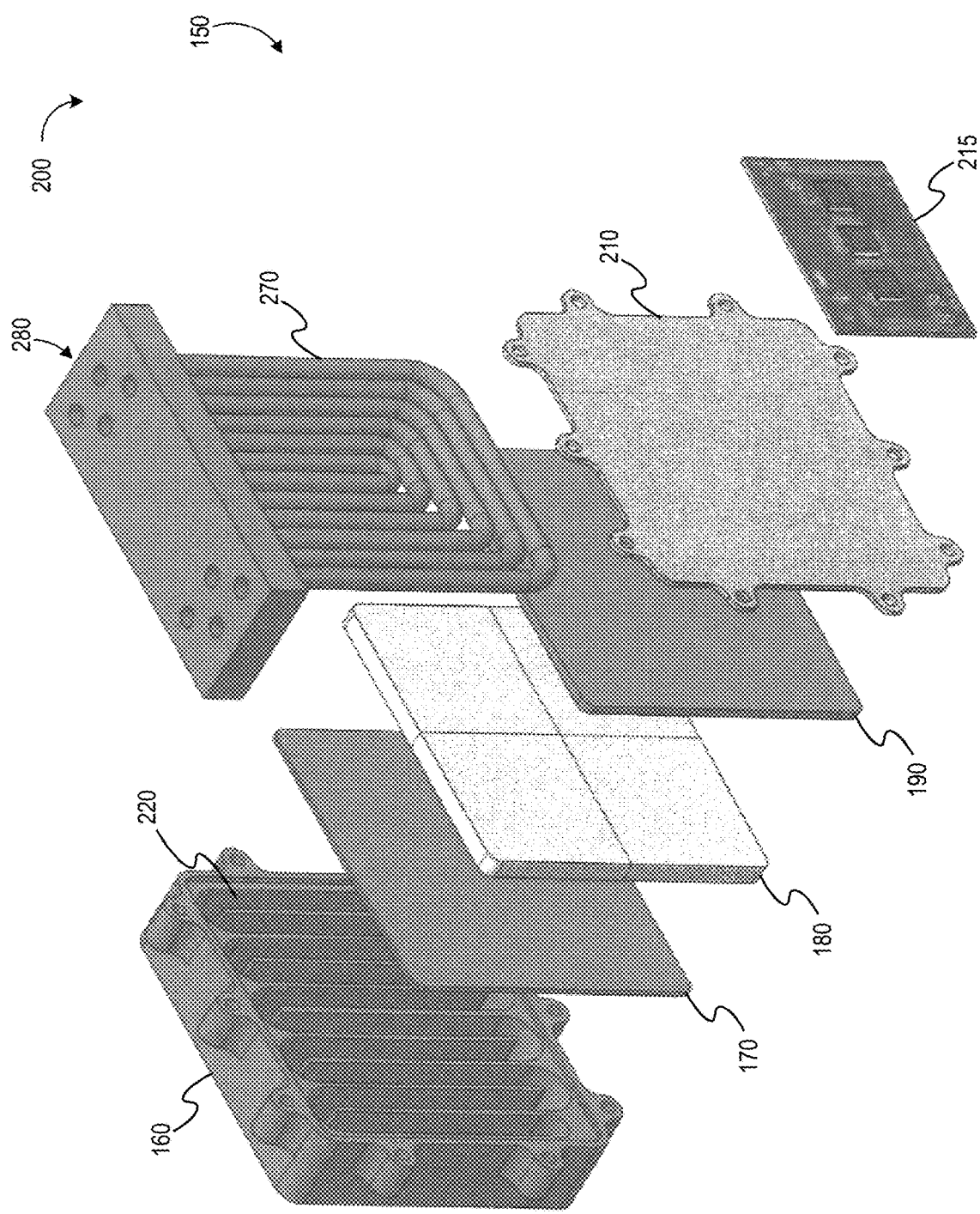
FIG. 3 is an exploded perspective view of a self-contained preassembled semiconductor computer cooling device of a self-contained preassembled semiconductor computer cooling system.
Figure 4:
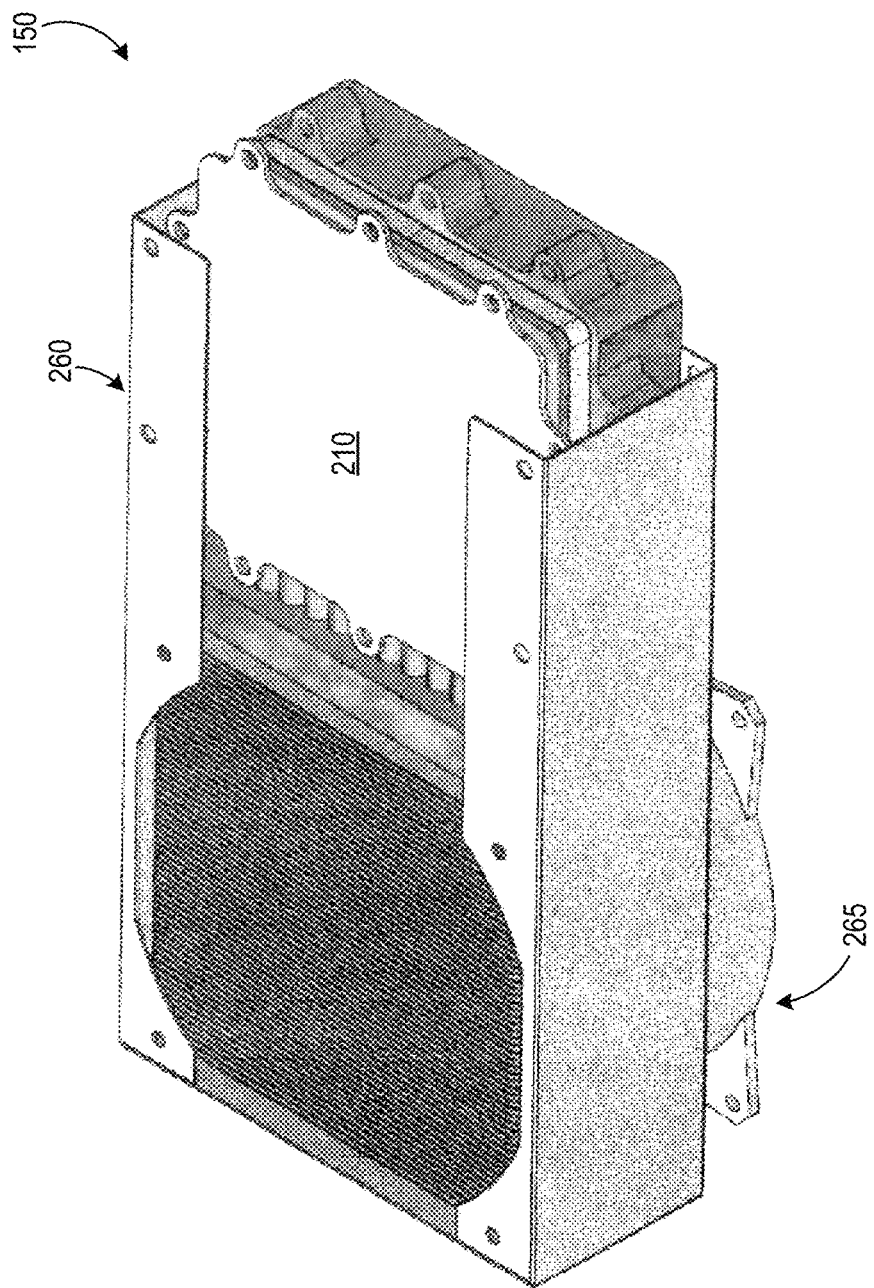
FIG. 4 is a rear perspective view of the self-contained preassembled semiconductor computer cooling device of FIG. 3.
Figure 5:
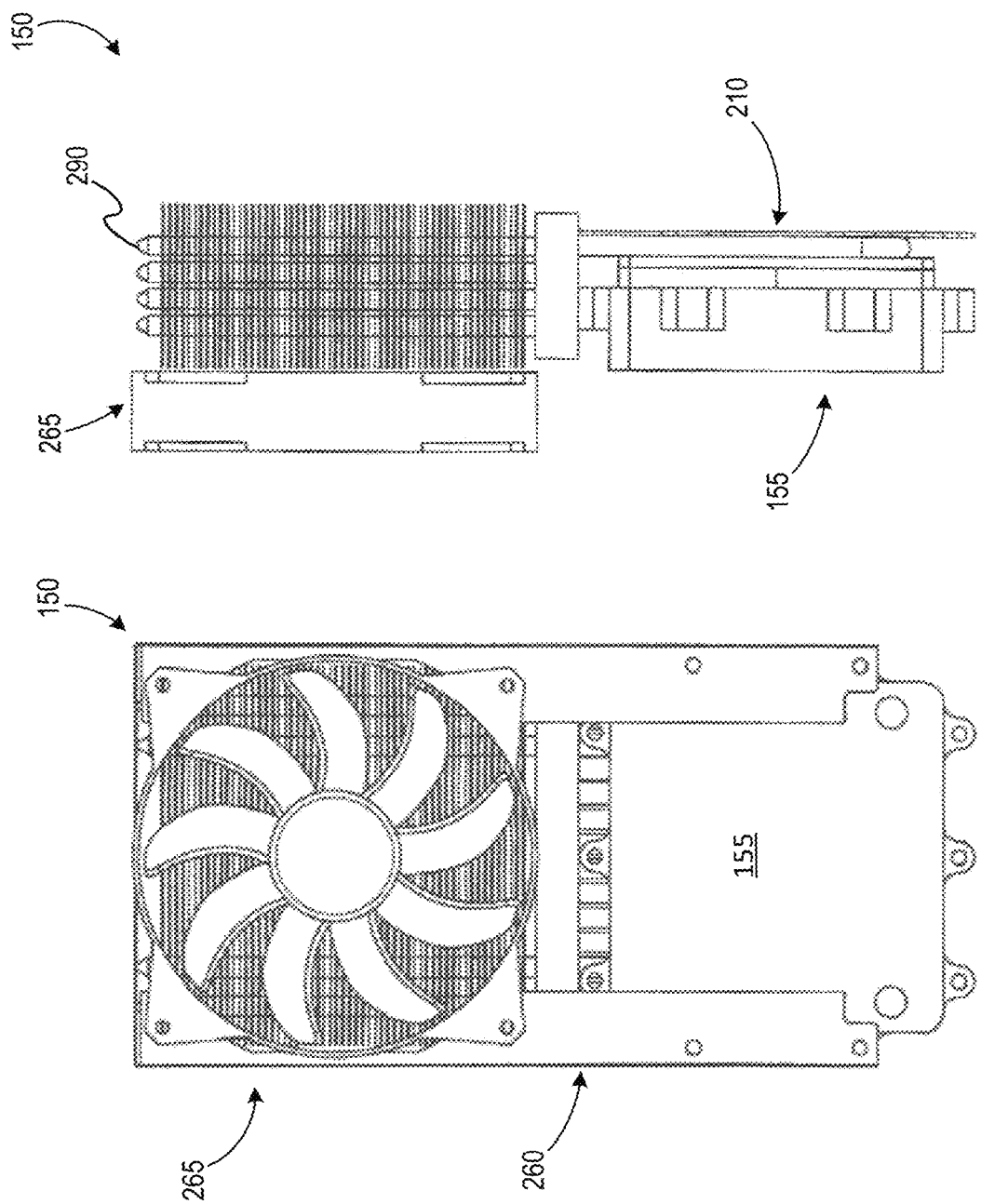
FIGS. 5A, 5B are front elevational and right side elevational views of the self-contained preassembled semiconductor computer cooling device of FIG. 3.

FIGS. 1 and 2 illustrate an embodiment of a self-contained preassembled semiconductor computer cooling system ("cooling system") 100 for a computer. The cooling system 100 is used to cool one or more heat-emitting components/individual semiconductor devices (e.g., microprocessor(s), CPU(s)) of a computer. In the embodiment shown, the computer is a computer terminal 110 with an enclosure/case 120 and a variety of computer components 130 such as a CPU 140 housed therein. The cooling system 100 provides a compact, effective universal computer enclosure cooling system meeting the cooling needs of current high-speed, heat producing computer systems and components.

With reference additionally to FIGS. 3-5B, the cooling system 100 includes a self-contained preassembled semiconductor computer cooling device ("cooling device") 150 adapted to current dimensional standards having a combined pump and liquid block 155, a copper tank 160, a cover (e.g., copper plate cover) 170, a Peltier plate 180 including one or more (e.g., 3) Peltier devices (i.e., solid-state active heat pump(s) which transfers heat from one side of the device to the other, with consumption of electrical energy, depending on the direction of the current), a heat exchanger cover/hot copper plate 190, a heat exchanger/heater exchanger pipe assembly 200, a steel cover plate 210, and control card 215. All components/sections in the cooling device 150 are separated with insulating material/boards and bolted together. Each of these components of the cooling device 150 will be described in turn below.

The combined pump and liquid block 155 includes a pump that plugs into the motherboard 250 and the block portion supports a front of the cooling device 150. In and out tube connections/tubing/liquid connections 230, 240 made of industrial rubber communicate heat transfer fluid (e.g., water) between combined pump and liquid block 155/copper tank 160, which includes serpentine liquid channels 220, and heat-emitting component heat exchanger 225, which is mounted on the CPU 140 for removing heating therefrom to cool the CPU 140.

The control card 215 is attached to a back of the copper tank 160 and includes one or more software modules to automatically adjust the pump's liquid flow rate in a closed end liquid loop design. The control card 215 manages the CPU 140, and uses thermistors that read and control temperatures of semiconductor (e.g., CPU 140), liquid, air, and the amount of voltage (from 0-12 volts) to the Peltier devices. The control card 215 is attached to a back of a plate of the copper tank 160 and plugs into a motherboard 250. The control card 215 increases or decreases voltage to Peltiers, thus increasing or decreasing cooling liquid temperature to maintain maximum performance for cooling a semiconductor such as CPU 140.

A metal design enclosure 260 (or more encompassing assembly cover) is an aluminum stamped product—supports total design in the shown height H, length L, and width W envelope, and traps heat which is forced into the ambient (attached inside upper panel inside the computer case replaces standard 120 mm fan). The assembly cover captures heat from the Peltier devices, heat pipes, and the motherboard 250 dumped to the ambient. There heat is forced out of the computer to ambient with a 120 mm exit fan 265. The enclosure 260 supports the cooling device 150 and is used for mounting the cooling device 150 to a back of the PC case 120. The complete cooling device 150 may be plastic wrapped (not shown). The plastic wrap covers the control card 215, copper tank 160, Peltier plate 190/Peltiers, insulators, wires, and heat pipes.

Copper plates (e.g., cover 170, hot copper plate 190) provide cold and hot heat transfer members from heat exchanger 200.

The Peltier devices may be any number (e.g. 1, 2, 3, 4, 5, etc.), but in the embodiment of FIGS. 3-5B, there are three 40-watt Peltiers. Each Peltier's cold side faces the copper tank 160 and each Peltier's hot side faces the heat exchanger 200. The hot Peltier plate attaches to a base of heat exchanger 200.

The heat exchanger 200 includes a heater exchanger pipe assembly with successively surrounded U-shaped heat pipes 270, which are very efficient heat conductors to improve heat dissipation from the hot copper plate 190 on the hot side of the Peltiers to a horizontal copper heat exchanger base 280. Heat is transferred from heat exchanger base 280 to a plurality of separate heat exchanger copper flat tubes 290 that are disposed within air flow path of the 120 mm exit fan/heat sink 265 for additional heat conduction (the exit fan 265 forces heat out to ambient from heat exchangers copper pipes/tubes 290). The heat exchanger base 280 is custom altered as a vertical configuration that attaches to the hot Peltier plate 180 and the U-shaped heat pipes/copper tubing 270 that conducts heat from the Peltier plate 180.

The steel cover/back plate 210 covers a back side of the heat exchanger and is the same size as the copper tank 160 with accompanying screw holes in both components.

The self-contained preassembled semiconductor computer cooling device 150 cools one or more heat-emitting components/individual semiconductor devices, providing a compact, effective universal computer enclosure cooling system meeting the cooling needs of current high-speed, heat producing computer systems and components. The cooling device eliminates the need for the following from PCs/computer terminals: installed heat/sink/fan, 120 mm exit fan in the top portion of the case, CPU heat sink and fan, exit the fan in the upper back section of the PC case, and additional fan spot.

Figure 6:
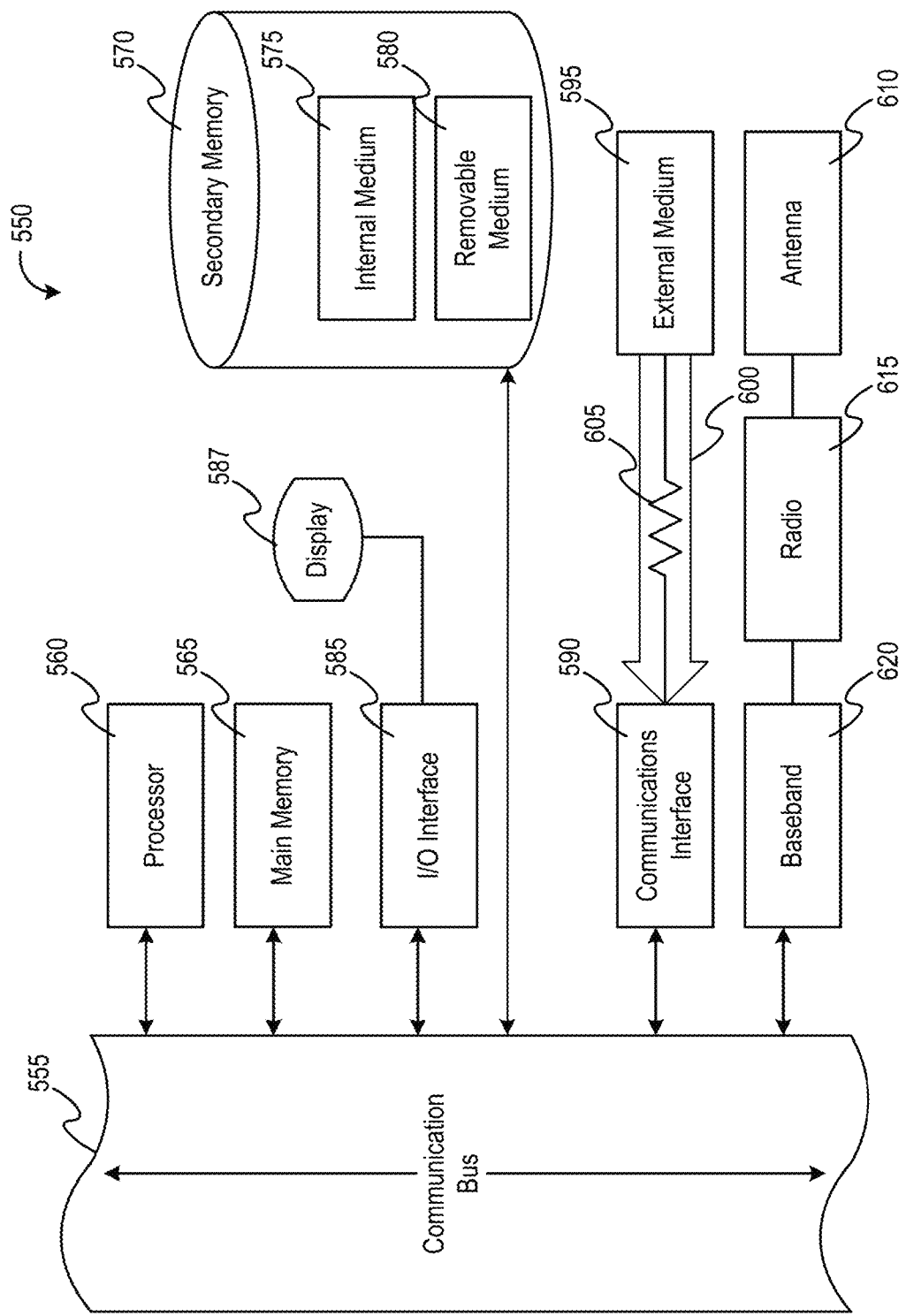
FIG. 6 is a block diagram illustrating an example wired or wireless processor enabled device that may be used in connection with various embodiments described herein.

FIG. 6 is a block diagram illustrating an example wired or wireless system 550 that may be used in connection with various embodiments described herein such as the control functions described herein with respect to the control card 215/CPU 140 shown and described herein. The system 550 can be a conventional personal computer, computer server, personal digital assistant, smart phone, tablet computer, or any other processor enabled device that is capable of wired or wireless data communication. Other computer systems and/or architectures may be also used, as will be clear to those skilled in the art.

The system 550 preferably includes one or more processors, such as processor 560. Additional processors may be provided, such as an auxiliary processor to manage input/output, an auxiliary processor to perform floating point mathematical operations, a special-purpose microprocessor having an architecture suitable for fast execution of signal processing algorithms (e.g., digital signal processor), a slave processor subordinate to the main processing system (e.g., back-end processor), an additional microprocessor or controller for dual or multiple processor systems, or a coprocessor. Such auxiliary processors may be discrete processors or may be integrated with the processor 560.

The processor 560 is preferably connected to a communication bus 555. The communication bus 555 may include a data channel for facilitating information transfer between storage and other peripheral components of the system 550. The communication bus 555 further may provide a set of signals used for communication with the processor 560, including a data bus, address bus, and control bus (not shown). The communication bus 555 may comprise any standard or non-standard bus architecture such as, for example, bus architectures compliant with industry standard architecture ("ISA"), extended industry standard architecture ("EISA"), Micro Channel Architecture ("MCA"), peripheral component interconnect ("PCI") local bus, or standards promulgated by the Institute of Electrical and Electronics Engineers ("IEEE") including IEEE 488 general-purpose interface bus ("GPIB"), IEEE 696/S-100, and the like.

System 550 preferably includes a main memory 565 and may also include a secondary memory 570. The main memory 565 provides storage of instructions and data for programs executing on the processor 560. The main memory 565 is typically semiconductor-based memory such as dynamic random access memory ("DRAM") and/or static random access memory ("SRAM"). Other semiconductor-based memory types include, for example, synchronous dynamic random access memory ("SDRAM"), Rambus dynamic random access memory ("RDRAM"), ferroelectric random access memory ("FRAM"), and the like, including read only memory ("ROM").

The secondary memory 570 may optionally include an internal memory 575 and/or a removable medium 580, for example a floppy disk drive, a magnetic tape drive, a compact disc ("CD") drive, a digital versatile disc ("DVD") drive, etc. The removable medium 580 is read from and/or written to in a well-known manner. Removable storage medium 580 may be, for example, a floppy disk, magnetic tape, CD, DVD, SD card, etc.

The removable storage medium 580 is a non-transitory computer readable medium having stored thereon computer executable code (i.e., software) and/or data. The computer software or data stored on the removable storage medium 580 is read into the system 550 for execution by the processor 560.

In alternative embodiments, secondary memory 570 may include other similar means for allowing computer programs or other data or instructions to be loaded into the system 550. Such means may include, for example, an external storage medium 595 and an interface 570. Examples of external storage medium 595 may include an external hard disk drive or an external optical drive, or and external magneto-optical drive.

Other examples of secondary memory 570 may include semiconductor-based memory such as programmable read-only memory ("PROM"), erasable programmable read-only memory ("EPROM"), electrically erasable read-only memory ("EEPROM"), or flash memory (block oriented memory similar to EEPROM). Also included are any other removable storage media 580 and communication interface 590, which allow software and data to be transferred from an external medium 595 to the system 550.

System 550 may also include an input/output ("I/O") interface 585. The I/O interface 585 facilitates input from and output to external devices. For example the I/O interface 585 may receive input from a keyboard or mouse and may provide output to a display 587. The I/O interface 585 is capable of facilitating input from and output to various alternative types of human interface and machine interface devices alike.

System 550 may also include a communication interface 590. The communication interface 590 allows software and data to be transferred between system 550 and external devices (e.g. printers), networks, or information sources. For example, computer software or executable code may be transferred to system 550 from a network server via communication interface 590. Examples of communication interface 590 include a modem, a network interface card ("NIC"), a wireless data card, a communications port, a PCMCIA slot and card, an infrared interface, and an IEEE 1394 fire-wire, just to name a few.

Communication interface 590 preferably implements industry promulgated protocol standards, such as Ethernet IEEE 802 standards, Fiber Channel, digital subscriber line ("DSL"), asynchronous digital subscriber line ("ADSL"), frame relay, asynchronous transfer mode ("ATM"), integrated digital services network ("ISDN"), personal communications services ("PCS"), transmission control protocol/Internet protocol ("TCP/IP"), serial line Internet protocol/point to point protocol ("SLIP/PPP"), and so on, but may also implement customized or non-standard interface protocols as well.

Software and data transferred via communication interface 590 are generally in the form of electrical communication signals 605. These signals 605 are preferably provided to communication interface 590 via a communication channel 600. In one embodiment, the communication channel 600 may be a wired or wireless network, or any variety of other communication links. Communication channel 600 carries signals 605 and can be implemented using a variety of wired or wireless communication means including wire or cable, fiber optics, conventional phone line, cellular phone link, wireless data communication link, radio frequency ("RF") link, or infrared link, just to name a few.

Computer executable code (i.e., computer programs or software) is stored in the main memory 565 and/or the secondary memory 570. Computer programs can also be received via communication interface 590 and stored in the main memory 565 and/or the secondary memory 570. Such computer programs, when executed, enable the system 550 to perform the various functions of the present invention as previously described.

In this description, the term "computer readable medium" is used to refer to any non-transitory computer readable storage media used to provide computer executable code (e.g., software and computer programs) to the system 550. Examples of these media include main memory 565, secondary memory 570 (including internal memory 575, removable medium 580, and external storage medium 595), and any peripheral device communicatively coupled with communication interface 590 (including a network information server or other network device). These non-transitory computer readable mediums are means for providing executable code, programming instructions, and software to the system 550.

In an embodiment that is implemented using software, the software may be stored on a computer readable medium and loaded into the system 550 by way of removable medium 580, I/O interface 585, or communication interface 590. In such an embodiment, the software is loaded into the system 550 in the form of electrical communication signals 605. The software, when executed by the processor 560, preferably causes the processor 560 to perform the inventive features and functions previously described herein.

The system 550 also includes optional wireless communication components that facilitate wireless communication over a voice and over a data network. The wireless communication components comprise an antenna system 610, a radio system 615 and a baseband system 620. In the system 550, radio frequency ("RF") signals are transmitted and received over the air by the antenna system 610 under the management of the radio system 615.

In one embodiment, the antenna system 610 may comprise one or more antennae and one or more multiplexors (not shown) that perform a switching function to provide the antenna system 610 with transmit and receive signal paths. In the receive path, received RF signals can be coupled from a multiplexor to a low noise amplifier (not shown) that amplifies the received RF signal and sends the amplified signal to the radio system 615.

In alternative embodiments, the radio system 615 may comprise one or more radios that are configured to communicate over various frequencies. In one embodiment, the radio system 615 may combine a demodulator (not shown) and modulator (not shown) in one integrated circuit ("IC"). The demodulator and modulator can also be separate components. In the incoming path, the demodulator strips away the RF carrier signal leaving a baseband receive audio signal, which is sent from the radio system 615 to the baseband system 620.

If the received signal contains audio information, then baseband system 620 decodes the signal and converts it to an analog signal. Then the signal is amplified and sent to a speaker. The baseband system 620 also receives analog audio signals from a microphone. These analog audio signals are converted to digital signals and encoded by the baseband system 620. The baseband system 620 also codes the digital signals for transmission and generates a baseband transmit audio signal that is routed to the modulator portion of the radio system 615. The modulator mixes the baseband transmit audio signal with an RF carrier signal generating an RF transmit signal that is routed to the antenna system and may pass through a power amplifier (not shown). The power amplifier amplifies the RF transmit signal and routes it to the antenna system 610 where the signal is switched to the antenna port for transmission.

The baseband system 620 is also communicatively coupled with the processor 560. The central processing unit 560 has access to data storage areas 565 and 570. The central processing unit 560 is preferably configured to execute instructions (i.e., computer programs or software) that can be stored in the memory 565 or the secondary memory 570. Computer programs can also be received from the baseband processor 610 and stored in the data storage area 565 or in secondary memory 570, or executed upon receipt. Such computer programs, when executed, enable the system 550 to perform the various functions of the present invention as previously described. For example, data storage areas 565 may include various software modules (not shown) that are executable by processor 560.

Various embodiments may also be implemented primarily in hardware using, for example, components such as application specific integrated circuits ("ASICs"), or field programmable gate arrays ("FPGAs"). Implementation of a hardware state machine capable of performing the functions described herein will also be apparent to those skilled in the relevant art. Various embodiments may also be implemented using a combination of both hardware and software.

Furthermore, those of skill in the art will appreciate that the various illustrative logical blocks, modules, circuits, and method steps described in connection with the above described figures and the embodiments disclosed herein can often be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled persons can implement the described functionality in varying ways for each particular application, but such implementation decisions should not be interpreted as causing a departure from the scope of the invention. In addition, the grouping of functions within a module, block, circuit or step is for ease of description. Specific functions or steps can be moved from one module, block or circuit to another without departing from the invention.

Moreover, the various illustrative logical blocks, modules, and methods described in connection with the embodiments disclosed herein can be implemented or performed with a general purpose processor, a digital signal processor ("DSP"), an ASIC, FPGA or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration.

Additionally, the steps of a method or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium including a network storage medium. An exemplary storage medium can be coupled to the processor such the processor can read information from, and write information to, the storage medium. In the alternative, the storage medium can be integral to the processor. The processor and the storage medium can also reside in an ASIC.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A computer component cooling device to cool one or more heat-emitting components of a computer, comprising:
   an exit fan that draws air there through and out of the computer in a flow path;
   a heat transfer tank including one or more channels therein to circulate a heat transfer fluid there through, the heat transfer fluid to impart cooling to the one or more heat-emitting components of the computer;
   a pump that pumps the heat transfer fluid between the heat transfer tank and one or more component heat exchangers to cool the one or more heat-emitting components of the computer;
   a heat exchanger including a plurality of heating elements extending therefrom and into the flow path of the exit fan;
   one or more Peltier devices including one or more cold sides thermally coupled to the heat transfer tank and one or more hot sides thermally coupled to the heat exchanger;
   wherein the heat exchanger includes a base that the plurality of heating elements extend from, and further including heat exchanger copper pipes extending from the base in an opposition direction from the plurality of heating elements.

2. The computer component cooling device of claim 1, wherein the computer component cooling device is a self-contained preassembled computer component cooling device.

3. The computer component cooling device of claim 1, wherein the one or more heat-emitting components of the computer include one or more semiconductors.

4. The computer component cooling device of claim 3, wherein the one or more semiconductors include one or more microprocessors.

5. The computer component cooling device of claim 1, wherein the pump is a combined pump and liquid block.

6. The computer component cooling device of claim 1, wherein the heat transfer tank is a copper tank.

7. The computer component cooling device of claim 6, further including a copper plate cover for the copper tank.

8. The computer component cooling device of claim 1, further including a Peltier plate including the one or more Peltier devices.

9. The computer component cooling device of claim 8, further including a copper plate between the Peltier plate and the heat exchanger.

10. The computer component cooling device of claim 1, further including a steel cover plate over the heat exchanger.

11. The computer component cooling device of claim 1, further including in and out tube connections to communicate the heat transfer fluid between the heat transfer tank and the one or more heat-emitting components of the computer.

12. The computer component cooling device of claim 1, wherein the heat exchanger copper pipes include successively surrounded U-shaped heat pipes.

13. The computer component cooling device of claim 1, further including a control card including one or more processors to automatically adjust a flow rate of the heat transfer fluid by the pump in a closed end liquid loop, and automatically adjusts voltage to the one or more Peltier devices to control the heating and cooling effect of the one or more Peltier devices, to maintain maximum performance for cooling the one or more heat-emitting components of the computer.

14. A method of using the computer component cooling device of claim 1, comprising:
   providing the computer component cooling device in a back of a computer case;
   fluidly communicating the heat transfer tank to one or more component heat exchangers through in and out tube connections;
   electrically communicating the control card to a motherboard of the computer, the control card including one or more processors;
   with the one or more processors of the control card, automatically adjusting the flow rate of the heat transfer fluid by the pump in a closed end liquid loop, and automatically adjusting voltage to the one or more Peltier devices to control the heating and cooling effect of the one or more Peltier devices, to maintain maximum performance for cooling the one or more heat-emitting components of the computer.

15. The method of claim 14, wherein the fan and the flow path are in the back of the computer case, and the method further comprising causing the fan to cause air to flow over the plurality of heating elements extending from the heat exchanger in the flow path to draw heat from the heat exchanger.

* * * * *